United States Patent
Chien et al.

(10) Patent No.: US 10,389,112 B2
(45) Date of Patent: Aug. 20, 2019

(54) DEVICE AND METHOD FOR GENERATING DUTY CYCLE

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hsu Chien, Yilan County (TW); Chih-Wen Cheng, New Taipei (TW); Jeng-Hung Tsai, Santa Clara, CA (US)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 307 days.

(21) Appl. No.: 15/255,148

(22) Filed: Sep. 2, 2016

(65) Prior Publication Data
US 2017/0346282 A1    Nov. 30, 2017

(30) Foreign Application Priority Data
May 25, 2016 (CN) .......................... 2016 1 0351867

(51) Int. Cl.
*H02J 1/00* (2006.01)
*H02M 3/158* (2006.01)
*H03K 5/156* (2006.01)
*H03L 7/081* (2006.01)

(52) U.S. Cl.
CPC ............... *H02J 1/00* (2013.01); *H02M 3/158* (2013.01); *H03K 5/1565* (2013.01); *H03L 7/0812* (2013.01)

(58) Field of Classification Search
CPC ........ H03K 5/1565; H02M 3/158; H02J 1/00; H03L 7/0812
See application file for complete search history.

(56) References Cited

U.S. PATENT DOCUMENTS

| | | | | |
|---|---|---|---|---|
| 5,907,254 A | * | 5/1999 | Chang | H03K 5/1565 327/165 |
| 6,198,322 B1 | * | 3/2001 | Yoshimura | H03K 5/04 327/153 |
| 6,384,652 B1 | * | 5/2002 | Shu | H03K 5/1565 327/165 |
| 6,578,154 B1 | * | 6/2003 | Wynen | H03K 5/1565 327/101 |
| 6,819,155 B1 | * | 11/2004 | Ling | H03K 5/1506 327/172 |
| 6,967,514 B2 | | 11/2005 | Kizer et al. | |

(Continued)

*Primary Examiner* — Pinping Sun
(74) *Attorney, Agent, or Firm* — CKC & Partners Co., LLC

(57) ABSTRACT

A device for generating a duty cycle includes a converter, a corrector, and a control circuit. The converter is configured to generate a first output signal having a duty cycle to an output terminal according to an input signal. The corrector is coupled to the output terminal, and is configured to adjust the duty cycle of the first output signal according to a control signal. The converter is coupled in parallel with the corrector and between a first power source and a second power source. The control circuit is coupled to the output terminal, and is configured to generate the control signal according to the first output signal and a reference signal.

14 Claims, 4 Drawing Sheets

(56) References Cited

U.S. PATENT DOCUMENTS

| | | | |
|---|---|---|---|
| 7,330,061 B2 | 2/2008 | Boerstler et al. | |
| 8,471,616 B2* | 6/2013 | Kim | H03K 5/1565 327/158 |
| 9,705,519 B1* | 7/2017 | Baringer | H03M 7/3073 |
| 2002/0070752 A1* | 6/2002 | Harrison | G06F 1/08 326/29 |
| 2002/0079939 A1* | 6/2002 | Nair | H03K 5/1565 327/175 |
| 2004/0189364 A1* | 9/2004 | Lee | H03K 5/1565 327/175 |
| 2006/0120119 A1* | 6/2006 | Sekimoto | H03K 3/017 363/41 |
| 2007/0132494 A1* | 6/2007 | Kim | H03K 5/023 327/175 |
| 2008/0143400 A1* | 6/2008 | Choi | H03L 7/0812 327/156 |
| 2008/0238487 A1* | 10/2008 | Alberkrack | G01R 29/0273 327/1 |
| 2009/0058483 A1* | 3/2009 | Shin | H03K 5/1565 327/175 |
| 2011/0291724 A1* | 12/2011 | Jain | H03K 5/1565 327/175 |
| 2015/0263716 A1* | 9/2015 | Lin | H03K 5/1565 327/175 |

* cited by examiner

US 10,389,112 B2

DEVICE AND METHOD FOR GENERATING DUTY CYCLE

RELATED APPLICATIONS

This application claims priority to China Application Serial Number 201610351867.0 filed May 25, 2016, which is herein incorporated by reference.

BACKGROUND

Technical Field

The present application relates to an integrated circuit. More particularly, the present application relates to a device and a method for generating a duty cycle.

Description of Related Art

In high-speed applications, which include, for example, memory devices, data transmission and/or communication, etc, as a tradeoff between a timing accuracy and a power consumption is concerned, the design for a clock generation circuit has become more and more difficult.

In some approaches, a clock scheme that employs a half-rate can be operated without reducing the system operating speed. The half-rate clock scheme usually requires a clock signal having a duty cycle of 50%, so as to perform operations according to a rising edge and a falling edge of this clock signal. However, in practical applications, the duty cycle of the clock signal cannot be kept accurately due to process variations and higher operating speed, etc.

SUMMARY

Some aspects of the present disclosure provide a device for generating a duty cycle. The device includes a converter, a corrector, and a control circuit. The converter is configured to generate a first output signal having a duty cycle to an output terminal according to an input signal. The corrector is coupled to the output terminal, and is configured to adjust the duty cycle of the first output signal according to a control signal. The converter is coupled in parallel with the corrector and between a first power source and a second power source. The control circuit is coupled to the output terminal, and is configured to generate the control signal according to the first output signal and a reference signal.

Some aspects of the present disclosure provide a device for generating a duty cycle. The device includes a first transistor, a second transistor, and a corrector. The second transistor is configured to cooperate with the first transistor to generate an output signal having a duty cycle to an output terminal according to an input signal. The corrector is configured to generate at least one current to the output terminal in response to the output signal, to adjust the duty cycle of the output signal. The at least one current is configured to be not flow through the first transistor and the second transistor.

Some aspects of the present disclosure provide a method for generating a duty cycle. The method includes the following operations: generating, by a converter, an output signal to an output terminal according to an input signal; generating a control signal based on the output signal and a reference signal; and generating at least one current according to the control signal, and transmitting the at least one current to the output terminal without transmitting through the converter to correct a duty cycle of the output signal.

As described above, the devices and the method provided in the present disclosure are able to correct the duty cycle of the output signal, by an arrangement of generating parallel current signals and a feedback mechanism, to improve the accuracy of the duty cycle of the output signal.

BRIEF DESCRIPTION OF THE DRAWINGS

This disclosure can be more fully understood by reading the following detailed description of the embodiment, with reference made to the accompanying drawings as follows.

DETAILED DESCRIPTION

Figure 1:
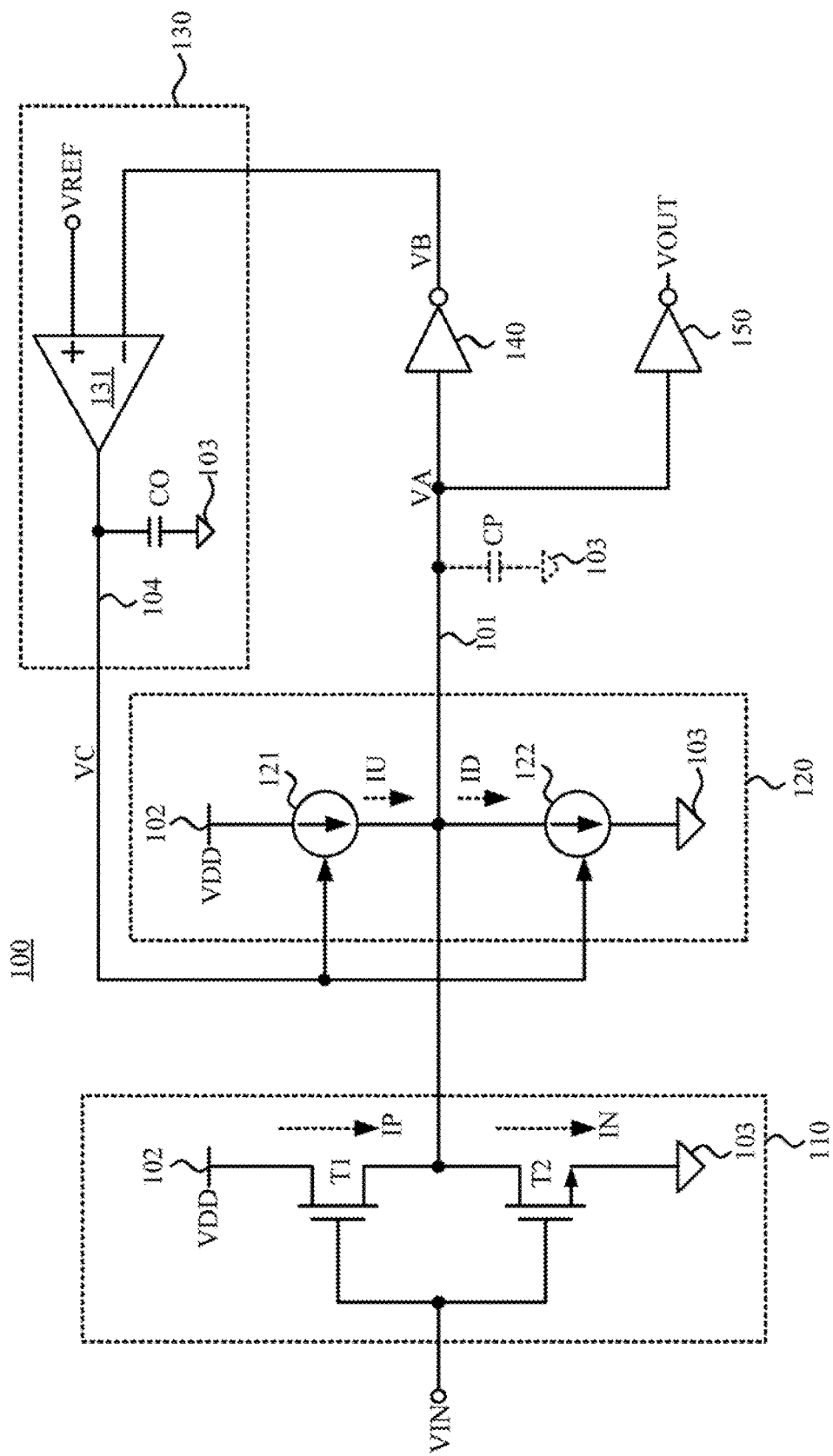
FIG. 1 is a schematic diagram of a device for generating a duty cycle, according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Although the terms "first," "second", etc., may be used herein to describe various elements, these elements should not be limited by these terms. These terms are used to distinguish one element from another.

In this document, the term "coupled" may also be termed as "electrically coupled," and the term "connected" may be termed as "electrically connected." "Coupled" and "connected" may also be used to indicate that two or more elements cooperate or interact with each other.

Reference is now made to FIG. 1. FIG. 1 is a schematic diagram of a device 100 for generating a duty cycle (hereinafter referred to as the device 100), according to some embodiments of the present disclosure. For illustration, the device 100 includes a converter 110, a corrector 120, and a control circuit 130.

The converter 110 is configured to generate an output signal VA to an output terminal 101 according to an input signal VIN, in which the output signal VA has a duty cycle. In some embodiments, the converter 110 is configured to convert a voltage signal to a pulse signal. In some embodiments, the duty cycle of the output signal VA is configured to be about 50%.

In some embodiments, the converter 110 includes a transistor T1 and a transistor T2. A first terminal of the transistor T1 is coupled to a power source 102 to receive a voltage VDD. A second terminal of the transistor T1 is coupled to an output terminal 101, and a control terminal of the transistor T1 is configured to receive the input signal VIN. A first terminal of the transistor T2 is coupled to the output terminal 101, a second terminal of the transistor T2 is coupled to a power source 103, and a control terminal of the transistor T2 is configured to receive the input signal VIN. In some embodiments, as shown in FIG. 1, the power source 103 is a reference ground terminal. Alternatively, in some other embodiments, the power source 103 is able to provide a system voltage that is lower than the voltage VDD.

In some embodiments, the transistor T1 is configured to cooperate with the transistor T2, according to the input signal VIN, to generate the output signal VA. In some embodiments, the transistor T1 and the transistor T2 are arranged as an inverter. The arraignments of the converter 110 are given for illustrative purposes only. Various types of the converter 110 are within the contemplated scope of the present disclosure.

The corrector 120 is coupled to the output terminal 101, and is configured to adjust the duty cycle of the output signal VA based on the output signal VA. For illustration, the corrector 120 generates an current IU and an current ID to the output terminal 101 according to a control signal VC, to adjust the duty cycle of the output signal VA, in which the control signal VC is generated, by the control circuit 130, based on the output signal VA.

In some embodiments, the corrector 120 and the converter 110 are configured to be coupled in parallel with each other and between the power sources 102 and 103. As a result, the corrector 120 is able to transmit the current IU and the current ID to the output terminal 101 without flowing through the converter 110, which includes, for example, the transistors T1 and T2.

For illustration, as shown in FIG. 1, the corrector 120 includes a current source circuit 121 and a current source circuit 122. The current source circuit 121 is coupled between the power source 102 and the output terminal 101, and is configured to generate the current IU to the output terminal 101 according to the control signal VC. The current source circuit 122 is coupled between the power source 103 and the output terminal 101, and is configured to generate the current ID according to the control signal VC, in which the current ID flows from the output terminal 101 to the power source 103.

In some embodiments, the current source circuits 121 and 122 are able to be implemented with voltage-controlled current source circuits, in order to generate the current IU and the current ID that have different values according to the control signal VC. In some embodiments, variable current source circuits, which are discussed above, are able to be implemented with various types of current mirror circuits. The circuit implementations of the corrector 120 are given for illustrative purposes only. Various types of the corrector 120 are within the contemplated scope of the present disclosure.

In some embodiments, the device 100 further includes a buffer 140 and a buffer 150. The buffer 140 is coupled to the output terminal 101 to generate an output signal VB, which has a higher driving capability, to the control circuit 130 according to the output signal VA. The buffer 150 is coupled to the output terminal 101 to generate an output signal VOUT, which has a higher driving capability, to an external electronic device (not shown) according to the output signal VA. It is understood that the buffer 140 and the buffer 150 are able to be selectively applied. Person skilled in the art would appreciate that the buffer 140 and the buffer 150 are able to be selectively arranged according to practical applications.

With continued reference to FIG. 1, the control circuit 130 is coupled to the output terminal 101 to generate the control signal VC based on the output signal VA. For illustration, in some embodiments, the control circuit 130 includes a comparator 131 and an output capacitor CO that is coupled to an output node 104. The comparator 131 is configured to compare the output signal VB with a reference signal VREF, to generate the control signal VC to the output node 104. In some other embodiments, the comparator 131 is also able to be configured to directly receive the output signal VA on a condition that the buffer 140 is not employed, and to compare the output signal VA with the reference signal VREF to generate the control signal VC.

Figure 2:
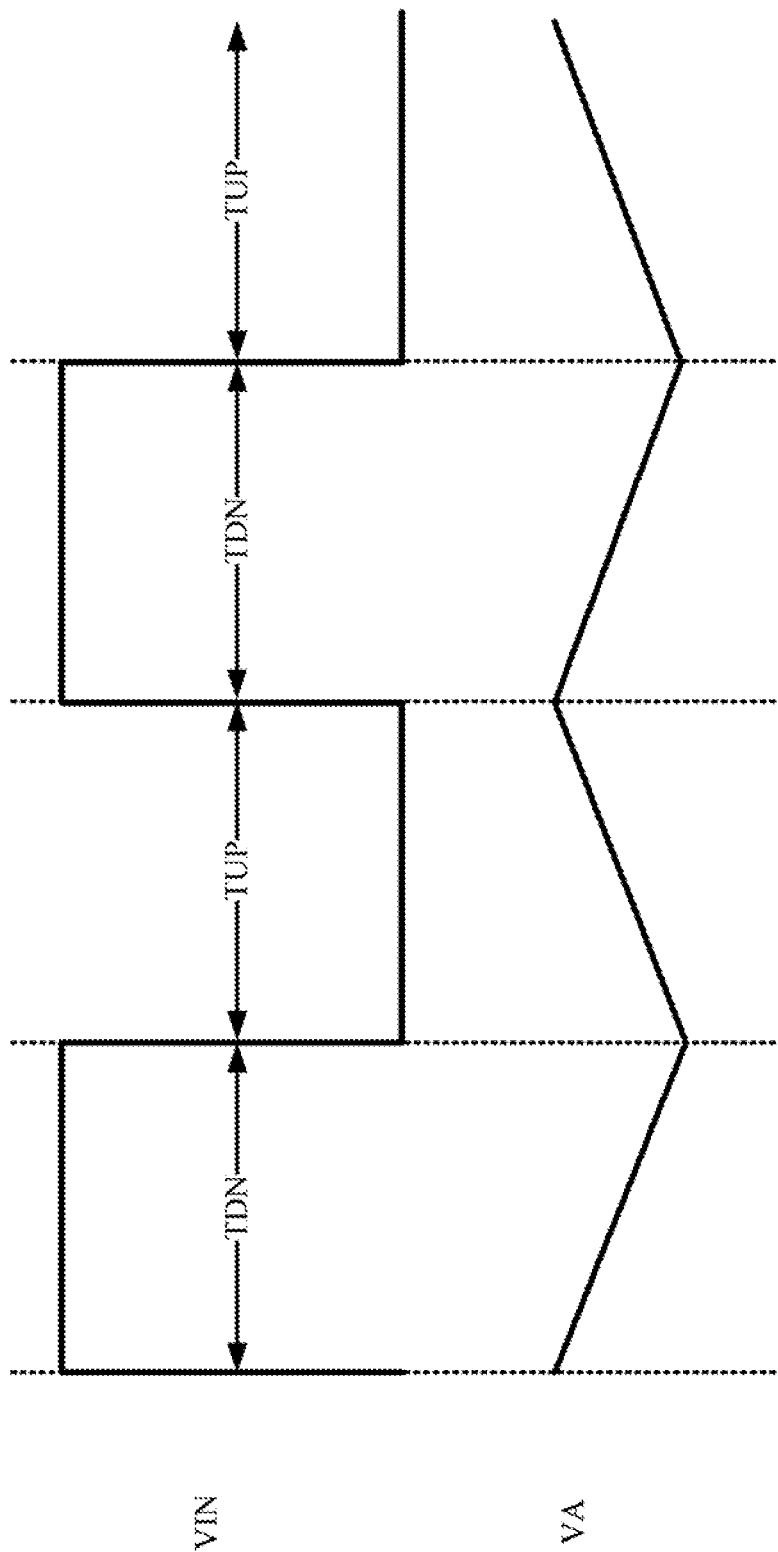
FIG. 2 is a schematic diagram of transient waveforms of the input signal and the output signal in FIG. 1, according to some embodiments of the present disclosure.

FIG. 2 is a schematic diagram of transient waveforms of the input signal VIN and the output signal VA in FIG. 1, according to some embodiments of the present disclosure. For illustrating related operations of the corrector 120, reference is now made to both of FIGS. 1-2.

As shown in FIG. 2, an enabling period TDN (i.e., the time interval of being at a high voltage level) of the input signal VIN at each period is configured to be about the same as an disabling period TUP (i.e., the time interval of being at a low voltage level), of the input signal VIN at each period. During the enabling period TDN of the input signal VIN, the transistor T1 is turned off, and the transistor T2 is turned on. Under this condition, a parasitic capacitance CP of the output terminal 101 is discharged through the current IN of the transistor T2, and thus the voltage level of the output signal VA is decreased. Alternatively, during the disabling period TUP of the input signal VIN, the transistor T1 is turned on, and the transistor T2 is turned off. Under this condition, the parasitic capacitance CP of the output terminal 101 is charged by the current IP of the transistor T1, and thus the voltage level of the output signal VA is increased.

In an ideal condition, when the corrector 110 is not operating, the voltage difference ΔVA, which is generated from the output signal VA during the charge-discharge progress, is expected to be zero, in order to achieve a duty cycle of 50%. Such relationship is able to be described as the following equation (1):

$$\Delta VA = \int \left( \frac{IP}{CP} \times TUP - \frac{IN}{CP} \times TDN \right) = 0 \qquad (1)$$

From the equation (1), in the ideal condition, if a product of the current IP and the disabling period TUP could be the same as a product of the current IN and the enabling period TSN, the voltage difference ΔVA is able to be zero. However, in practical applications, the current IP and the current IN would have a mismatch between each other due to process variations, internal parasitic resistances of the transistors T1-T2, higher operating speed, etc. Thus, the voltage difference ΔVA is unable to be zero. As a result, the duty cycle of the output signal cannot be kept at 50% accurately.

In some embodiments, with the arrangement of the feedback control of the control circuit 130, when a mismatch is present between the current IP and the current IN, the different current IU and the current ID are generated from the current source circuits 121 and 122 to the output terminal 101 for compensating, in order to make the voltage difference ΔVA be zero. Effectively, the current mismatch is corrected. As a result, the duty cycle of the input signal VA is able to be kept at 50%. Such operations are able to be described as the following equation (2):

$$TUP \times (IP+IU) = TDN \times (IN+ID) \qquad (2)$$

In some approaches, the corrector, which is configured for correcting the duty cycle, is connected to the converter in cascode. In other words, the current, which is outputted from the corrector, flows to the output terminal through the converter for compensating. Accordingly, a mismatch is still present in the current, which is outputted from the corrector, due to a parasitic resistance of an internal transistor in the converter. As a result, the duty cycle of the output signal cannot be kept at 50% accurately. In addition, in the corrector that employs the cascode circuit architecture, as the transmission path for transmitting the current is much longer, and the control mechanism for such longer transmission path is generally more complex, the duty cycle of the output signal requires a longer stabling time. As a result, such corrector in the approaches above is not able to be applied in a higher speed application.

Compared with the approaches above, the corrector 120 in the present disclosure is configured to be coupled in parallel with the converter 110. In other words, the current IU and the current ID, which are generated from the corrector 120, are transmitted to the output terminal 101 without passing through the converter 110. Compared with the approaches above, the duty cycle of the output signal VA can be kept at 50% more accurately. Furthermore, as the current IU and the current ID can be directly transmitted to the output terminal 101, the duty cycle of the output signal VA can be corrected back to 50% in a relatively faster speed. Relatively speaking, the device 100 for generating the duty cycle is able to be applied in a higher speed application.

Figure 3:
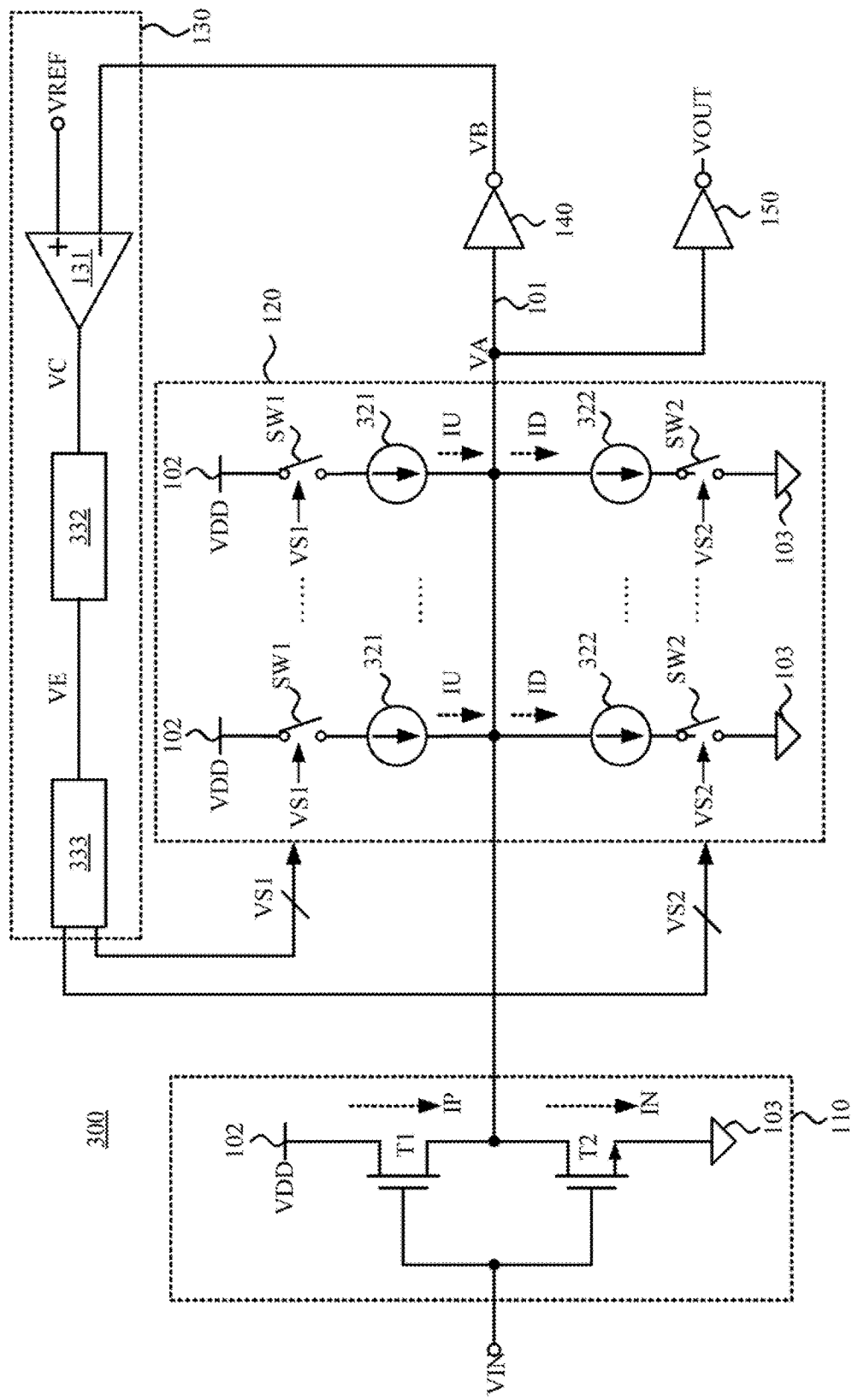
FIG. 3 is a schematic diagram of a device for generating a duty cycle, according to some other embodiments of the present disclosure.

Reference is now made to FIG. 3. FIG. 3 is a schematic diagram of a device 300 for generating a duty cycle (hereinafter the device 300), according to some other embodiments of the present disclosure. With respect to FIG. 1, like elements in FIG. 3 are designated with the same reference numbers for ease of understanding.

Compared with the device 100 in FIG. 1, the corrector 120 and the control circuit 130 of the device 300 can be implemented with digital circuits. For illustration, as shown in FIG. 3, the corrector 120 includes current source circuits 321, current source circuits 322, switches SW1 and switches SW2.

As shown in FIG. 3, each of the switches SW1 is coupled between the power source 102 and a corresponding one of the current source circuits 321. Each of the switches SW1 is configured to be selectively turned on according to a corresponding one of switching signals VS1. Each of the current source circuit 321 is configured to generate the current IU to the output terminal 101 on a condition that the corresponding switch SW1 is turned on.

Each of the switches SW2 is coupled between the power source 103 and a corresponding one of the current source circuit 322. Each of the switches SW2 is configured to be selectively turned on according to a corresponding one of switching, signals VS2. Each of the current source circuit 322 is configured to generate the current ID, which flows from the output terminal 101 to the power source 103, on a condition that the corresponding switch SW2 is turned on.

With continued reference to FIG. 3, in some embodiments, the control circuit 130 includes a comparator 131, an encoder 332, and a demultiplexer 333. The comparator 131 is configured to compare the output signal VB with the reference signal VREF, in order to generate a control signal VC. The encoder 332 is coupled to an output terminal of the comparator 131 to receive the control signal VC. The encoder 332 is configured to generate an encoded signal VE according to the control signal VC. For example, in some embodiments, the encoder 332 encodes the control signal VC to generate the encoded signal VE. Alternatively, in some other embodiments, the encoder 332 is implemented with a counter, and is configured to count according to the status of the control signal VC, in order to generate a different encoded signal VE. The demultiplexer 333 is coupled to an output terminal of the encoder 332 to receive the encoded signal VE. In some embodiments, the encoded signal VE is configured to have n+1 bits, where n is a positive integer, a number of the switches SW1 is n, and a number of the switches SW2 is n. In some embodiments, the demultiplexer 333 is configured to, according to one bit of the encoded signal VE, select outputs for remaining n bits of the encode signal VE, to generate the switching signals VS1 and VS2.

With the arrangements above, when an offset is present in the output signal VA, the comparator 131 outputs the control signal VC having different statuses. The encoder 332 thus outputs the different encoded signal VE. As a result, the demultiplexer 333 generates the corresponding switching signals VS1 and VS2 based on the encoded signal VE, in order to turn on a corresponding number of the switches SW1 and SW2 to generate the corresponding current IU and the current ID to the output terminal 101. As described above, effectively, the duty cycle of the output signal VA is corrected to a predetermined duty cycle (e.g., 50%), by the current IU and the current ID.

As described above, in some other embodiments, the comparator 131 in FIG. 3 is also able to directly receive the output signal VA on a condition that the buffer 140 is not employed, and is able to compare the output signal VA with the reference signal VREF to generate the control signal VC.

The arrangements of the corrector 120 and the control circuit 130 are given for illustrative purposes only. Various types of digital circuits, which are able to implement the corrector 120 and the control circuit 130, are also within the contemplated scope of the present disclosure.

The values of the duty cycle in the various embodiments above are given for illustrative purposes only. Various values of the duty cycle are also within the contemplated scope of the present disclosure.

Figure 4:
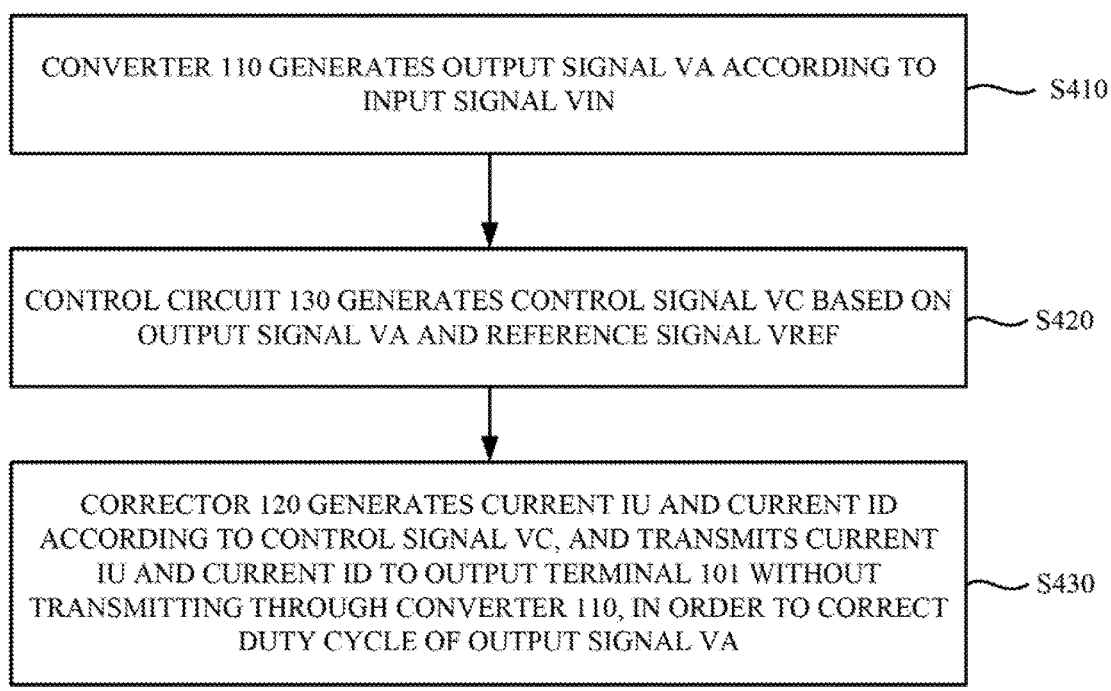
FIG. 4 is a flow chart of a method for generating a duty cycle, according to some embodiments of the present disclosure.

Reference is now made to FIG. 4. FIG. 4 is a flow chart of a method 400 for generating a duty cycle (hereinafter the method 400), according to some embodiments of the present disclosure. For ease of understanding, reference is now made to both of FIG. 1 and FIG. 4.

As shown in FIG. 4, the method 400 includes operations S410, S420, and S430. In operation S410, the converter 110 generates the output signal VA according to the input signal VIN. For illustration, as shown in FIG. 1, the converter 110 is arranged as an inverter circuit to generate a different output signal VA according to the input signal VIN.

In operation S420, the control circuit 130 generates the control signal VC based on the output signal VA and the reference signal VREF. For illustration, as shown in FIG. 1, the comparator 131 can compare the output signal VB and the reference signal VREF to generate the control signal VC, in which the output signal VB is generated, according to the output signal VA, by the buffer 140.

In operation S430, the corrector 120 generates the current IU and the current ID according to the control signal VC, and transmits the current IU and the current ID to the output terminal 101 without transmitting through the converter 110, in order to correct the duty cycle of the output signal VA. For illustration, as shown in FIG. 1, the current source circuits 121 and 122 selectively provide the current IU and the current ID, according to the control signal VC, to the output terminal 101. Both of the current source circuits 121 and 122 are coupled in parallel with the converter 110 and between the current sources 102 and 103. As a result, the current IU and the current ID can be transmitted to the output terminal 101 without passing through the converter 110.

As described above, the device 100 and the method 400 provided in the present disclosure are able to correct the duty cycle of the output signal, by an arrangement of generating parallel current signals and a feedback mechanism, to improve the accuracy of the duty cycle of the output signal.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A device for generating a duty cycle ratio for a clock, comprising:
   a converter configured to generate a first output signal having the duty cycle ratio to an output terminal according to an input signal;
   a corrector coupled to the output terminal, and configured to adjust the duty cycle ratio of the first output signal according to a single control signal, wherein the converter is coupled in parallel with the corrector and between a first power source and a second power source, wherein the corrector comprises: a first current source circuit directly coupled between the first power source and the output terminal, and configured to generate a first current; and a second current source circuit directly coupled between the output terminal and the second power source, and configured to generate a second current; wherein only the single control signal is transferred to the corrector to control both the first current source circuit and the second current source circuit to generate and directly inject the first current and the second current with different current values to the output terminal to adjust the duty cycle ratio of the first output signal; and
   a control circuit coupled to the output terminal, and configured to generate the control signal according to the first output signal and a reference signal.

2. The device of claim 1, wherein the converter comprises:
   a first transistor coupled between the first power source and the output terminal; and
   a second transistor coupled between the output terminal and the second power source,
   wherein the first transistor and the second transistor are configured to output the first output signal to the output terminal according to the input signal.

3. The device of claim 1, wherein the second current flows from the output terminal to the second power source.

4. The device of claim 1, wherein the control circuit comprises:
   a comparator configured to compare the first output signal with the reference signal to generate the control signal to an output node; and
   an output capacitor coupled to the output node.

5. The device of claim 4, further comprising:
   a buffer coupled to the output terminal, and configured to generate a second output signal according to the first output signal,
   wherein the comparator is further configured to compare the second output signal with the reference signal to generate the control signal.

6. The device of claim 1, wherein the corrector is configured to generate at least one signal to the output terminal to adjust the duty cycle ratio of the first output signal, and the at least one signal does not flow through the converter.

7. A device for generating a duty cycle ratio for a clock, comprising:
   a first transistor;
   a second transistor configured to cooperate with the first transistor to generate an output signal having the duty cycle ratio to an output terminal according to an input signal; and
   a corrector configured to generate at least one current to the output terminal in response to the output signal according to a single control signal, to adjust the duty cycle ratio of the output signal, wherein the corrector comprises: a first current source circuit directly coupled between the first power source and the output terminal, and configured to generate a first current; and a second current source circuit directly coupled between the output terminal and the second power source, and configured to generate a second current; wherein only the single control signal is transferred to the corrector to control both the first current source circuit and the second current source circuit to generate and directly inject the first current and the second current with different current values to the output terminal to adjust the duty cycle ratio of the first output signal,
   wherein the at least one current is configured to be not flowing through the first transistor and the second transistor.

8. The device of claim 7, wherein the second current flows from the output terminal to the second power source.

9. The device of claim 8, further comprising:
   a control circuit coupled to the output terminal, and configured to generate the control signal according to the output signal and a reference signal.

10. The device of claim 9, wherein the control circuit comprises:
    a comparator configured to compare the output signal with the reference signal to generate the control signal to an output node; and
    an output capacitor coupled to the output node.

11. A method for generating a duty cycle ratio for a clock, comprising:
    generating, by a converter, an output signal to an output terminal according to an input signal;
    generating a single control signal based on the output signal and a reference signal; and
    generating, by a corrector, at least one current according to the control signal, and transmitting the at least one current to the output terminal without transmitting through the converter to correct the duty cycle ratio of the output signal,
    wherein the corrector comprises: a first current source circuit directly coupled between the first power source and the output terminal, and configured to generate a first current; and a second current source circuit directly coupled between the output terminal and the second power source, and configured to generate a second current; wherein only the single control signal is transferred to the corrector to control both the first current source circuit and the second current source circuit to generate and directly inject the first current and the second current with different current values to the output terminal to adjust the duty cycle ratio of the first output signal.

12. The method of claim 11, wherein the corrector and the converter are coupled in parallel with each other and between a first power source and a second power source.

13. The method of claim 11, wherein generating the control signal comprises:
    comparing the output signal with the reference signal to generate the control signal.

14. The method of claim 11, wherein the second current flows from the output terminal to the second power source.

* * * * *